(12) United States Patent
Liu et al.

(10) Patent No.: US 11,946,148 B2
(45) Date of Patent: Apr. 2, 2024

(54) HAFNIUM OXIDE CORROSION INHIBITOR

(71) Applicant: Versum Materials US, LLC, Tempe, AZ (US)

(72) Inventors: Wen Dar Liu, Chupei (TW); Yi-Chia Lee, Chupei (TW)

(73) Assignee: Versum Materials US, LLC, Tempe, AZ (US)

( * ) Notice: Subject to any disclaimer, the term of this patent is extended or adjusted under 35 U.S.C. 154(b) by 149 days.

(21) Appl. No.: 17/416,328

(22) PCT Filed: Jan. 10, 2020

(86) PCT No.: PCT/US2020/013110
§ 371 (c)(1),
(2) Date: Jun. 18, 2021

(87) PCT Pub. No.: WO2020/146748
PCT Pub. Date: Jul. 16, 2020

(65) Prior Publication Data
US 2022/0064803 A1 Mar. 3, 2022

Related U.S. Application Data

(60) Provisional application No. 62/791,270, filed on Jan. 11, 2019.

(51) Int. Cl.
*C23F 11/06* (2006.01)
*C23F 1/32* (2006.01)
(Continued)

(52) U.S. Cl.
CPC ............ *C23F 11/06* (2013.01); *C23F 1/32* (2013.01); *H01L 21/02068* (2013.01); *H01L 21/32134* (2013.01)

(58) Field of Classification Search
CPC ...... C23F 11/06; C23F 1/32; H01L 21/02068; H01L 21/32134
(Continued)

(56) References Cited

U.S. PATENT DOCUMENTS 6,224,785 B1 * 5/2001 Wojtczak ............. C11D 7/3281
257/E21.228
9,831,088 B2 * 11/2017 Chen ................. H01L 21/32134
(Continued)

FOREIGN PATENT DOCUMENTS

EP 1 211 563 A1 6/2002
EP 2 034 365 A2 3/2009
(Continued)

OTHER PUBLICATIONS

Hussain, Muhammad Mustafa, et al., "Metal Wet Etch Issues and Effects in Dual Metal Gate Stack Integration," Journal of The Electrochemical Society, 153(5), 2006, pp. G389-G393.
(Continued)

*Primary Examiner* — Duy Vu N Deo
(74) *Attorney, Agent, or Firm* — William T. Slaven, IV

(57) ABSTRACT

Described herein is an etching solution suitable for the selective removal of TiSiN over hafnium oxide from a microelectronic device, which consists essentially of: water; at least one alkaline ammonium compound selected from the group consisting of ammonium hydroxide, a quaternary ammonium hydroxide, ammonium fluoride, and a quaternary ammonium fluoride; at least one peroxide compound; a water-miscible organic solvent; at least one nitrogen containing compound selected from the group consisting of a $C_{4-12}$ alkylamine, a polyalkylenimine, and a polyamine; and optionally at least one chelating agent.

17 Claims, 2 Drawing Sheets

(51) Int. Cl.
*H01L 21/02* (2006.01)
*H01L 21/3213* (2006.01)

(58) Field of Classification Search
USPC .......... 252/79.1–79.5; 438/745–754; 216/96, 216/99, 100, 103–109
See application file for complete search history.

(56) References Cited

U.S. PATENT DOCUMENTS

| | | |
|---|---|---|
| 2010/0065530 A1 | 3/2010 | Walker et al. |
| 2010/0112728 A1 | 5/2010 | Korzenski et al. |
| 2010/0216315 A1 | 8/2010 | Yaguchi et al. |
| 2016/0047053 A1 | 2/2016 | Sugishima et al. |
| 2016/0200975 A1 | 7/2016 | Cooper et al. |
| 2017/0107460 A1* | 4/2017 | Liu .................. H01L 21/31111 |
| 2017/0145311 A1 | 5/2017 | Liu et al. |
| 2018/0187133 A1* | 7/2018 | Namiki ............. H01L 21/02068 |
| 2019/0276739 A1 | 9/2019 | Liu et al. |

FOREIGN PATENT DOCUMENTS

| | | | |
|---|---|---|---|
| EP | 3 040 409 A1 | 7/2016 | |
| EP | 3 089 200 A1 | 11/2016 | |
| EP | 3 540 764 A1 | 9/2019 | |
| SG | 10201902037 | 10/2019 | |
| WO | WO-2014197808 A1 * | 12/2014 | ............. C09K 13/00 |

OTHER PUBLICATIONS

Supplementary European Search Report, EP 20 73 9066, The Hague, dated Aug. 16, 2022.

Intellectual Property Office of Singapore; Search Report; Application No. 11202107061T; dated Jan. 3, 2023.

Seiwa Patent & Law; Japanese Patent Application No. 2021-540119; References cited in letter dated Jan. 12, 2024.

* cited by examiner

HAFNIUM OXIDE CORROSION INHIBITOR

This application is a national stage application, filed under 35 U.S.C. § 371, of International Patent Application No. PCT/US2020/013110 (filed on Jan. 10, 2020) which claims the benefit of U.S. Provisional Patent Application No. 62/791,270 (filed on Jan. 11, 2019) each of which applications is incorporated herein by reference in their entirety.

BACKGROUND OF THE INVENTION

The present invention relates to aqueous etching solutions used in the manufacture of semiconductor devices. More specifically, the present invention relates to an etching solution used for selectively etching a sacrificial material layer such as, for example, titanium silicide nitride (TiSiN) in a process for producing a semiconductor device comprising a polysilicon-based gate electrode formed on a layer of high dielectric (high k) material.

MOS field-effect transistors with very thin gate dielectrics made from silicon dioxide may experience unacceptable gate leakage currents. Forming the gate dielectric from certain high-k dielectric materials such as, for example, hafnium oxide, in place of silicon dioxide, can reduce gate leakage. Such a dielectric may not, however, be compatible with polysilicon—the preferred material for making the device's gate electrode. Placing a thin layer of titanium nitride or titanium silicide nitride which is compatible with many high-k gate dielectrics, between a high-k gate dielectric and a polysilicon-based gate electrode may enable such a dielectric to be used with such a gate electrode. Unfortunately, the presence of such a layer may increase the transistor's threshold voltage, which is undesirable, so it must be removed.

During the manufacture of certain devices such as, for example, a p-type device, a layer of titanium silicide nitride (TiSiN) is typically employed over conventional metal gate materials (e.g., TaN and TiN) over a high k layer of hafnium oxide ($HfO_2$). To pattern the gate structure, it is preferred to have a wet chemical etching composition that has high etch selectivity toward TiSiN without damaging the hafnium oxide. If the wet chemistry penetrates and causes at least partial removal of the $HfO_2$, such damage will negatively impact the electrical performance of the device. Accordingly, there is a need in the art for a wet chemical etching composition that will remove TiSiN preferentially to $HfO_2$ without suffering from the aforementioned drawbacks.

BRIEF SUMMARY OF THE INVENTION

This need is met by the present disclosure in that the inventors have discovered a composition useful for the selective removal of TiSiN over hafnium oxide.

In one aspect, there is provided an etching solution suitable for the selective removal of TiSiN over $HfO_2$ from a microelectronic device, which comprises: water; at least one alkaline ammonium compound selected from the group consisting of ammonium hydroxide, a quaternary ammonium hydroxide, ammonium fluoride, and a quaternary ammonium fluoride; at least one peroxide compound; a water-miscible organic solvent; at least one nitrogen containing compound selected from the group consisting of a $C_{4-12}$ alkylamine, a polyalkylenimine, and a polyamine; and optionally at least one chelating agent.

In another aspect, provided herein is a method for selectively enhancing the etch rate of TiSiN relative to $HfO_2$ in a composite semiconductor device comprising TiSiN and $HfO_2$, the method comprising the steps of: contacting the composite semiconductor device comprising TiSiN and $HfO_2$ with an aqueous composition comprises: water; at least one alkaline ammonium compound selected from the group consisting of ammonium hydroxide, a quaternary ammonium hydroxide, ammonium fluoride, and a quaternary ammonium fluoride; at least one peroxide compound; a water-miscible organic solvent; at least one nitrogen containing compound selected from the group consisting of a $C_{4-12}$ alkylamine, a polyalkylenimine, and a polyamine; and optionally at least one chelating agent; and rinsing the composite semiconductor device after the TiSiN is at least partially removed, wherein the selectivity of the etch for TiSiN over $HfO_2$ is greater than 30.

In another aspect there is provided an etching solution suitable for the selective removal of TiSiN over hafnium oxide from a microelectronic device, which comprises, consists essentially of, or consists of: from about 3.7 to about 4.5 wt. %, or from about 3.7 to about 5.5 wt. % neat of at least one alkaline ammonium compound selected from the group consisting of ammonium hydroxide, a quaternary ammonium hydroxide, ammonium fluoride, and a quaternary ammonium fluoride; from about 3.9 to about 4.5 wt. % neat of at least one peroxide compound; from about 7 to about 12 wt. %, or from about 10 to about 15 wt. % of a water-miscible organic solvent; from about 0.4 to about 0.6 wt. % from about 0.4 to about 0.8 wt. % of at least one nitrogen containing compound selected from the group consisting of a $C_{4-12}$ alkylamine, a polyalkylenimine, and a polyamine; water; and optionally at least one chelating agent.

In another aspect there is provided an etching solution suitable for the selective removal of polysilicon over silicon oxide from a microelectronic device, which comprises, consists essentially of, or consists of: about 4.1 wt. % of ammonium hydroxide (neat); about 4.3% of hydrogen peroxide (neat); from about 0.4 to about 1.2 wt. % of ammonium fluoride (neat); about 10% of a water-miscible organic solvent; from about 0.3 to about 0.5% or from about 0.3 to about 0.8% of at least one nitrogen containing compound selected from the group consisting of a $C_{4-12}$ alkylamine, a polyalkylenimine, and a polyamine; water; and optionally at least one chelating agent.

The embodiments of the invention can be used alone or in combinations with each other.

DETAILED DESCRIPTION OF THE INVENTION

Figure 1:
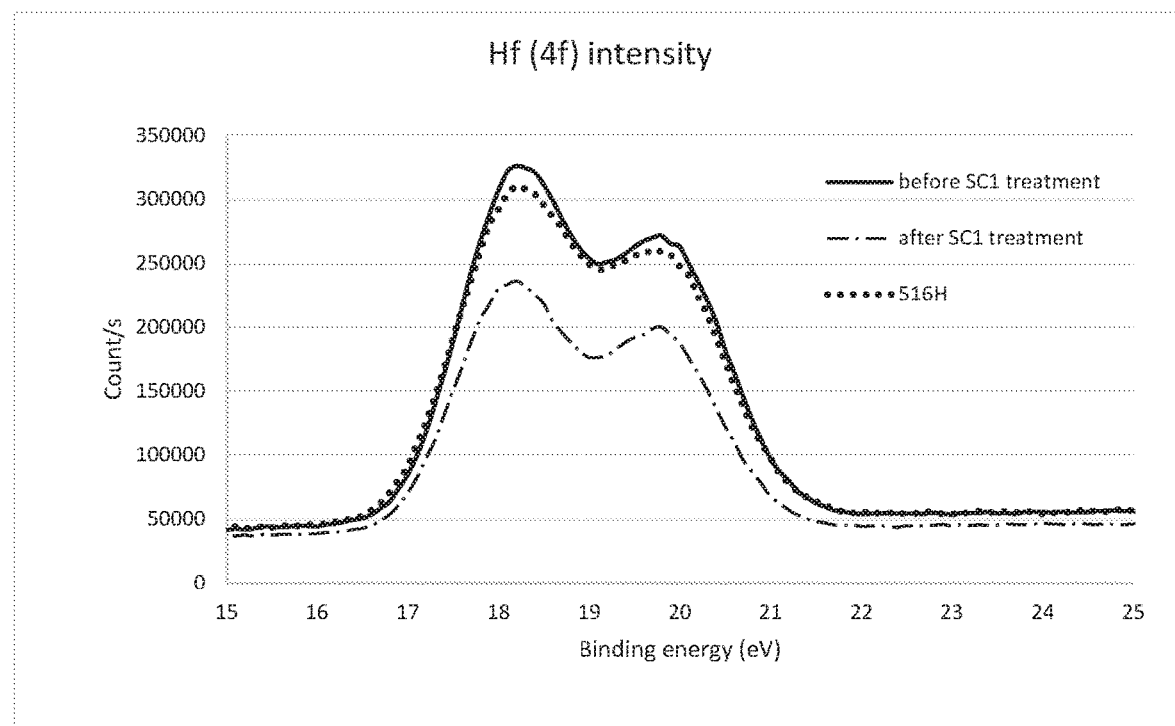
FIG. 1 is a graphic illustration of $HfO_2$ loss by XPS analysis comparing SC1 to a composition disclosed herein.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the more narrow language of "consisting essentially of" and "consisting of."

Embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of TiSiN over hafnium oxide from a microelectronic device having such material(s) thereon during its manufacture.

For ease of reference, "microelectronic device" or "semiconductor device" corresponds to semiconductor substrates, for example wafers, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" or "semiconductor device" is not meant to be limiting in any way and includes any substrate that will eventually become a microelectronic device or microelectronic assembly.

A "composite semiconductor device" or "composite microelectronic device" means that the device has more than one materials and/or layers and/or portions of layers present on a non-conductive substrate. The materials may comprise high K dielectrics, and/or low K dielectrics and/or barrier materials and/or capping materials and/or metal layers and/or others known to persons of skill.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "high-k dielectric material" refers to a material having a dielectric constant higher than that of silicon oxide and includes hafnium oxide.

"Substantially free" is defined herein as less than 0.001 wt. %. "Substantially free" also includes 0.000 wt. %. The term "free of" means 0.000 wt. %.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Note all percentages of the components are weight percentages and are based on the total weight of the composition, that is, 100%.

In the broad practice of this aspect, the etching solution of the present development comprises, consists essentially of, or consists of: water; at least one alkaline ammonium compound selected from the group consisting of ammonium hydroxide, a quaternary ammonium hydroxide, ammonium fluoride, and a quaternary ammonium fluoride; at least one peroxide compound; at least one water-miscible organic solvent; at least one nitrogen containing compound selected from the group consisting of a $C_{4-12}$ alkylamine, a polyalkylenimine, and a polyamine; and optionally at least one chelating agent.

In some embodiments, the etching solution compositions disclosed herein are formulated to be substantially free of or free of at least one of the following chemical compounds: metal hydroxides, trace metal cations, silicon-containing compounds, chlorine-containing compounds, bromine-containing compounds, iodine-containing compounds, phosphorus-containing compounds, magnesium-containing compounds, and alkanolamines.

The compositions of the present invention are suitable for use in a process for making a gate all around structure on an electronic device. Such processes are known in the art such as, for example, the process disclosed in U.S. Pat. No. 6,617,209, U.S. patent application Publication No. 2017/0179248, U.S. patent application Publication No. 2017/0104062, U.S. patent application Publication No. 2017/0133462, and U.S. patent application Publication No. 2017/0040321, the disclosures of which are incorporated herein by reference.

The headings employed herein are not intended to be limiting; rather, they are included for organizational purposes only.

The compositions disclosed herein exhibit excellent TiSIN removal preferentially over hafnium oxide.

Water

The etching compositions of the present development are aqueous-based and, thus, comprise water. In the present invention, water functions in various ways such as, for example, to dissolve one or more components of the composition, as a carrier of the components, as an aid in the removal of residue, as a viscosity modifier of the composition, and as a diluent. Preferably, the water employed in the cleaning composition is de-ionized (DI) water. The ranges of water described in the next paragraph and otherwise herein include all of the water in the composition from any source.

It is believed that, for most applications, the weight percent of water in the composition will be present in a range with start and end points selected from the following group of numbers: 0.5, 1, 5, 10, 15, 17, 20, 23, 25, 30, 35, 40, 45, 50, 55, 60, 65, 70, 72, 74, 75, 76, 78, 80, 82, 84, 85, 86, 88, 90, 91, 92, 93, 94, 95, 96, 97, 98, 99, 99.2, 99.3, 99.4, and 99.5. Examples of the ranges of water that may be used in the composition include, for examples, from about 40% to about 95% by wt., or 50% to about 95% by wt. of water; or from about 70% to about 90% by wt., or from about 70% to about 85% by wt., or from about 75% to about 90% by wt., or from about 75% to about 85% by wt. of water. Still other preferred embodiments of the present invention may include water in an amount to achieve the desired weight percent of the other ingredients. Still other preferred embodiments of the present invention may include the portion of the composition that is other than the amount of the other ingredients neat.

Alkaline Ammonium Compound

The etching compositions disclosed herein additionally comprises one or more alkaline ammonium compounds. The alkaline ammonium compound functions to aid in the etching of the TiSiN. The one or more alkaline ammonium compounds may be selected to provide the desired etch rate(s). Examples of these alkaline ammonium compounds include compounds such as, for example, ammonium hydroxide (NH$_4$OH) and quaternary ammonium compounds and ammonium fluoride. Quaternary ammonium compounds include quaternary ammonium hydroxides, such as, tetraalkylammonium hydroxides and quaternary ammonium fluorides, such as, tetraalkylammonium fluorides. Exemplary quaternary ammonium hydroxides (and tetraalkylammonium hydroxides) may be those compounds having the formula [NR$^1$R$^2$R$^3$R$^4$]$^+$OH$^-$ wherein R$^1$, R$^2$, R$^3$, and R$^4$ are each independently hydrogen, an alkyl group, a hydroxyalkyl group, and combinations thereof. Exemplary quaternary ammonium fluorides (and tetraalkylammonium fluorides) may be those compounds having the formula [N—R$^1$R$^2$R$^3$R$^4$]$^+$F$^-$ wherein R$^1$, R$^2$, R$^3$, and R$^4$ are each independently hydrogen, an alkyl group, a fluoroalkyl group, and combinations thereof. The term "alkyl" as used herein refers to straight or branched chain hydrocarbon groups of 1 to 20 carbon atoms, or from 1 to 8 carbon atoms, or from 1 to 4 carbon atoms. Examples of suitable alkyl groups include methyl, ethyl, propyl, isopropyl, butyl, and tertbutyl. The term "hydroxyalkyl" as used herein refers to straight or branched hydroxyl groups containing hydrocarbon groups of from 1 to 20 carbon atoms, or from 1 to 8 carbon atoms, or from 1 to 4 carbon atoms. The term "fluoroalkyl" as used herein refers to straight or branched fluoro groups containing hydrocarbon groups of from 1 to 20 carbon atoms, or from 1 to 8 carbon atoms, or from 1 to 4 carbon atoms. Examples of suitable fluoroalkyl groups include fluoroethyl and fluoropropyl.

Examples of suitable quaternary ammonium hydroxide compounds (and tetraalkylammonium hydroxides) include ones in which all of the R groups are the same (but are not all H) or ones in which the R groups are not all the same, such as, tetramethylammonium hydroxide (TMAH), tetraethylammonium hydroxide (TEAH), tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, choline hydroxide, benzyltrimethylammonium hydroxide (Triton B), and mixtures thereof.

Examples of suitable quaternary ammonium fluoride compounds include ones in which all of the R groups are the same (but are not all H) or ones in which the R groups are not all the same, such as, tetramethylammonium fluoride (TMAF), tetraethylammonium fluoride, tetrabutylammonium fluoride (TBAF), tetrapropylammonium fluoride, trimethylethylammonium fluoride, (2-hydroxyethyl)trimethylammonium fluoride, (2-hydroxyethyl)triethylammonium fluoride, (2-hydroxyethyl)tripropylammonium fluoride, (1-hydroxypropyl)trimethylammonium fluoride, ethyltrimethylammonium fluoride, diethyldimethylammonium fluoride and benzyltrimethylammonium fluoride.

In some embodiments, the etching composition disclosed herein comprises ammonium hydroxide as the alkaline ammonium component. With regard to the concentration of the alkaline ammonium compound, in some embodiments the total alkaline ammonium compound may be used in an amount that is from about 3.7 to about 5.5 wt. %, or from about 3.7 to about 5.5 wt. %, or from about 3.7 to about 4.5 wt. %, (neat, i.e., notwithstanding the water solvent component) based on the total weight of the composition. In some embodiments, if ammonium fluoride or quaternary ammonium fluoride is present in the composition, it may be from about 0.1 to about 2.0 wt %, or from about 0.1 to about 1.8 wt %, or from about 0.4 to about 1.5 wt %.

In other embodiments, the amount of the total amount or each alkaline ammonium compound if more than one is present (neat, i.e., without the water component) in the composition will, for the most applications, comprise weight percents within a range having start and end points selected from the following group of numbers: 0.1, 0.2, 0.3, 0.4, 0.5, 0.6, 0.7, 0.8, 0.9, 1, 1.2, 1.4, 1.5, 1.8, 2, 2.5, 3, 3.7, 3.9, 4, 4.1, 4.5, 4.7, 5, 5.2, 5.5, 5.7, 6, 6.2, 6.5, 7, 7.5, 8, 9, 10, 11, 12, 13, 14, 15, 17, 18, 19, and 20. Additional examples of ranges of the alkaline ammonium compound in the compositions disclosed herein may be from about 0.5 wt. % to about 20 wt. %, or from about 1.0 wt. % to about 15 wt. %, or from about 1.3% to about 15% by weight of the composition (neat). By way of example, if the alkaline ammonium compound is (or includes) an ammonium hydroxide (29% solution), then if added at about 14% by weight of the etching formulation, there will be 4.06% active ammonium hydroxide compound in the etching formulation.

In some embodiments, ammonium hydroxide and ammonium fluoride may be used in the etching compositions of this invention. In one embodiment, ammonium hydroxide is present at about 4.0 wt. % neat and ammonium fluoride is present at from about 0.4 to 1.2 wt. % neat.

Peroxide Compound

The compositions disclosed herein comprise a peroxide compound which also functions to etch the TiSiN. The peroxide compound to be used in the composition may include but is not limited to hydrogen peroxide, ammonium persulfate, peracidic acid, peroxybenzoic acid, and combinations thereof. As an example, if a peroxide compound is a 30% hydrogen peroxide solution, the hydrogen peroxide may be used in the composition at a concentration of from about 1 to about 80 wt %, preferably from about 10 to about 30 wt %, and more preferably from about 10 to about 20 wt %, and still more preferably from about 14 to about 16 wt %.

In some embodiments, the peroxide compound (on a neat basis) comprises comprise weight percents within a range having start and end points selected from the following group of numbers: 0.1, 0.2, 0.3, 0.4, 0.5, 0.6, 0.7, 0.8, 0.9, 1, 2, 2.5, 3, 3.5, 3.8, 3.9, 4, 4.3, 4.5, 5, 5.5, 6, 6.5, 7, 7.5, 8, 9, 10, 11, 12, 13, 14, 15, 16, 17, 18, 19, 20, 22, 25, 28, and 30.

In other embodiments, the peroxide compound is present in the composition at from about 0.5 wt. % to about 30 wt. %, or from about 1 wt. % to about 10 wt. %, or from about 2 wt. % to about 8 wt. % neat. In one embodiment, the peroxide compound is present at about 4.5 wt. % neat.

Water-Miscible Organic Solvent

The etching compositions of the present invention optionally comprise a water-miscible organic solvent. Examples of water-miscible organic solvents that can be employed are ethylene glycol, propylene glycol, 1,4-butanediol, tripropylene glycol methyl ether, propylene glycol propyl ether, diethylene glycol n-butyl ether (BDG) (e.g., commercially available under the trade designation Dowanol® DB), dipropylene glycol methyl ether (DPM) hexyloxypropylamine, poly(oxyethylene)diamine, dimethylsulfoxide (DMSO), tetrahydrofurfuryl alcohol, glycerol, alcohols, sulfolane, sulfoxides, or mixtures thereof. Preferred solvents are alcohols, diols, or mixtures thereof. Most preferred solvents are sulfolane and polyols including diols, such as, for example, ethylene glycol and propylene glycol, and triols, such as, for example, glycerol.

It is believed that, for most applications, the amount of water-miscible organic solvent in the composition, if employed, may be in a range having start and end points selected from the following list of weight percents: 0.5, 1, 3, 5, 7, 10, 12, 13, 14, 15, 20, 25, 29, 30, 33, 35, 40, 44, 50, 59.5. Examples of such ranges of solvent include from about 0.5% to about 59.5% by weight; or from about 5% to about 50% by weight; or from about 1% to about 40% by weight; or from about 0.5% to about 30% by weight; or from about 1% to about 30% by weight; or from about 5% to about 30% by weight; or from about 5% to about 15% by weight; or from about 7% to about 10%, or about 10% by weight of the composition.

Nitrogen-Containing Compound (Hafnium Oxide Corrosion Inhibitor)

The etching compositions of the present invention comprise at least one nitrogen-containing compound selected from the group consisting of a $C_{4-12}$ alkylamine, a polyalkylenimine, and a polyamine. Preferably, the at least one nitrogen-containing compound is present in the composition at from about 0.1 wt. % to about 10 wt. % (neat).

Examples of suitable $C_{4-12}$ alkylamines include hexylamine, octylamine, decylamine, and dodecylamine.

Preferably, the polyalkyleneamine is a polyethyleneimine (PEI). Any PEI may be used, but it is preferred that a homopolymeric polyethyleneimine is employed. The PEI may be branched or linear, but preferably it is branched.

While it has been found that the PEI used may have any formula weight for effectiveness, preferably the PEI has a lower formula weight (FW). In an embodiment, the PEI has a FW between 100 and 50,000, between 400 and 25,000, between 800 and 10,000, or between 1000 and 3000.

In an embodiment, the polyalkyleneamine comprises a polyethyleneimine (PEI) and preferably the PEI comprises from about 0.1 to about 10% by weight of the composition, preferably less than 5.0% by weight, preferably less than 2.5% by weight, preferably less than 1.5% by weight, preferably less than 1.0% by weight, or less than 0.8% by weight of the composition or less than 0.5% by weight of the composition. Preferably the PEI has a molecular weight between 100 and 2500, preferably 200 and 1500 and most preferably between 400 and 1200.

In a preferred embodiment, the polyalkyleneamine has a molecular weight between 100 and 2500, between 200 and 1500, between 400 and 1200, or between 700 and 900. A molecular weight of 800 is particularly suitable. The molecular weight is suitably determined by light scattering techniques known in the art.

Polyethyleneimines are commercially available, for example Lupasol® 800 which is supplied by BASF.

Examples of polyamines include pentamethyldiethylenetriamine (PMDETA), triethylenediamine (TEDA), tiethylenetetramine (TETA), tetramethylethylenediamine (TMEDA), and diethylenetriamine (DETA).

The at least one nitrogen containing compound functions primarily to protect the hafnium oxide from corrosion or etching.

In some embodiments two or more nitrogen containing compounds are used in the etching compositions of this invention. In some embodiments, two or more polyamines, two or more $C_{4-12}$ alkylamines, or two or more polyalkyleneimines may be used in the compositions of this invention. In alternative embodiments mixtures of at least two of a polyamine, a $C_{4-12}$ alkylamine, and a polyalkylenimine may be used in the etching compositions of this invention. For examples, in some embodiments, mixtures of PMDETA and octylamine may be used. In alternative embodiments mixtures of PMDETA and PEI may be used in the compositions of this invention.

It is believed that, for most applications, the total amount of the at least one nitrogen-containing compound selected from the group consisting of a $C_{4-10}$ alkylamine, a polyalkylenimine, and a polyamine in the composition may be in a range having start and end points selected from the following list of weight percents: 0.01, 0.05, 0.10, 0.15, 0.20, 0.25, 0.30, 0.35, 0.40, 0.45, 0.50, 0.55, 0.60, 0.65, 0.70, 0.75, 0.80, 0.85, 0.90, 0.95, 1.0, 1.25, 1.3, 1.5, 2, 2.5, 2.75, 3.0, 3.25, 3.5, 3.75, 4.0, 4.25, 4.50, 4.75, 5, 6, 7, 8, 9, and 10. Examples of such ranges of the at least one nitrogen-containing compound include from about 0.01% to about 4.0% by weight; or from about 0.10% to about 3.0% by weight; or from about 0.10% to about 2% by weight; or from about 0.3% to about 1% by weight; or from about 0.10% to about 6% by weight; or from about 0.3% to about 2% by weight of the composition.

Chelating Agents (Optional)

The etching compositions of the present invention may optionally comprise at least one chelating agent. The one or more chelating agents may be aminophosphonic acids, aminocarboxylic acids, organic acids, preferably with multiple functional groups, and other known chelating agents. These include, for example, ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine. In some embodiments, the chelating agents are selected from ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA) and 1,3-diamino-2-hydroxypropane-N,N,N',N'-tetraacetic acid (DHPTA). Preferred chelating agents are aminocarboxylic acids such as EDTA, CyDTA, DEPTA and HEDTA. In some embodiments aminophosphonic acids such as EDTMP may be used. In some embodiments, mixtures of chelating agents are used.

It is believed that, for most applications, the total amount of the at least chelating agent in the composition may be in a range having start and end points selected from the following list of weight percents: 0, 0.01, 0.05, 0.10, 0.15, 0.20, 0.25, 0.30, 0.35, 0.40, 0.45, 0.50, 0.55, 0.60, 0.65, 0.70, 0.75, 0.80, 0.85, 0.90, 0.95, 1.0, 1.25, 1.3, 1.5, 2, 2.5, 2.75, 3.0, 3.25, 3.5, 3.75, 4.0, 4.25, 4.50, 4.75, 5 and 6. Examples of such ranges of the at least one chelating agent include from about 0.01% to about 4.0% by weight; or from about 0.10% to about 3.0% by weight; or from about 0.10% to about 2% by weight; or from about 0.3% to about 1% by weight; or from about 0.10% to about 6% by weight; or from about 0.3% to about 2% by weight of the composition.

Surfactants (Optional)

The etching compositions of the present invention optionally comprise at least one surfactant. The surfactant functions to protect the silicon oxide from etching. Surfactants for use in the compositions described herein include, but are not limited to, amphoteric salts, cationic surfactants, anionic surfactants, zwitterionic surfactants, non-ionic surfactants, and combinations thereof including, but not limited to, bis(2-ethylhexyl)phosphate, perfluoroheptanoic acid, perfluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, and dodecyl phosphate.

Non-ionic surfactants contemplated include, but are not limited to, polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis(ethoxylate-block-propoxylate) tetrol (Tetronic 90R4), polyethylene glycols (e.g., PEG 400), polypropylene glycols, polyethylene or polypropylene glycol ethers, block copolymers based on ethylene oxide and propylene oxide (Newpole PE-68 (Sanyo), Pluronic L31, Pluronic 31R1, Pluronic L61, Pluronic F-127), polyoxypropylene sucrose ether (SN008S, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched (IGEPAL CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and ethoxylated fluorosurfactants (ZONYL® FSO-100, ZONYL® FSN-100).

Cationic surfactants contemplated include, but are not limited to, cetyl trimethylammonium bromide (CTAB), heptadecanefluorooctane sulfonic acid, tetraethylammonium, stearyl trimethylammonium chloride (Econol TMS-28, Sanyo), 4-(4-diethylaminophenylazo)-1-(4-nitrobenzyl) pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336 and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide and di(hydrogenated tallow)dimethylammonium chloride (e.g., Arquad 2HT-75, Akzo Nobel). In some embodiments, cationic surfactants, for examples, bromide-containing surfactants, such as, 1-hexadecyltrimethylammonium bromide are preferred.

Anionic surfactants contemplated include, but are not limited to, ammonium polyacrylate (e.g., DARVAN 821A), modified polyacrylic acid in water (e.g., SOKALAN CP10S), phosphate polyether ester (e.g., TRITON H-55), decylphosphonic acid, dodecylphosphonic acid (DDPA), tetradecylphosphonic acid, hexadecylphosphonic acid, octadecylphosphonic acid, dodecylbenzenesulfonic acid, poly (acrylic acid sodium salt), sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RMO2, and phosphate fluorosurfactants such as Zonyl FSJ and ZONYL® UR.

Zwitterionic surfactants include, but are not limited to, acetylenic diols or modified acetylenic diols (e.g., SURFONYL® 504), cocamido propyl betaine, ethylene oxide alkylamines (AOA-8, Sanyo), N,N-dimethyldodecylamine N-oxide, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropanesulfonate. Preferably, the at least one surfactant comprises dodecylbenzene sulfonic acid, dodecyl phosphonic acid, dodecyl phosphate, TRITON X-100, SOKALAN CP10S, PEG 400, and PLURONIC F-127.

When present, the amount of surfactant may be in a range from about 0.001 wt. % to about 5 wt. %, or 0.001 wt. % to about 1 wt. %, or from about 0.01 to about 1 wt. %, or about 0.1 wt. % to about 1 wt. %, based on the total weight of the composition. Alternatively, it is believed that for some applications, if present, the one or more surfactants will comprise from about 0.1 wt. % to about 15 wt. % of the composition; or from about 0.1 wt. % to about 10 wt. %, or from about 0.5 wt. % to about 5 wt. %, or from about 0.05 wt. % to about 2 wt. %, or about 0.5 wt. % to about 5 wt. % of the composition. In alternative embodiments the weight percent of surfactant in the composition, based on the total weight of the composition may be within any range having start and end points selected from the following: 0.001, 0.01, 0.05, 0.1, 0.5, 1, 2, 4, 5, 8, 10 and 15.

In some embodiments the compositions of this invention will be free of or substantially free of any or all of the above-listed surfactants in any combination, or any of the above listed types of surfactants in any combination.

Other Optional Ingredients

The etching composition of the present invention may also include one or more of the following additives: chemical modifiers, dyes, biocides, and other additives. The additive(s) may be added to the extent that they do not adversely affect the performance of the composition. The additives such as dyes, biocides etc. can be included in the cleaning composition in conventional amounts, for example, amounts up to a total of about 5 weight % of the composition. In some embodiments the compositions of this invention will be free of or substantially free of any or all of the above-listed additives.

Examples of some embodiments of this invention will comprise from about 10% to about 95% by wt., or from about 70% to about 90% by wt., or from about 75% to about 85% by wt. water; from about 0.5% to about 50% by wt., or from about 1% to about 20% by wt., or 1% to about 15% by wt., or from about 1% to about 10% by wt. of at least one alkaline ammonium compound (neat); from about 0.5% to about 30% by wt., or from about 0.5% to about 20% by wt., or 1% to about 15% by wt., or from about 1.5% to about 10% by wt. of at least one peroxide compound (neat); from about 1% to about 60% by wt., or from about 2% to about 30% by wt., or from about 5% to about 15% by wt. water-miscible solvent; from about 0.10% to about 10% by wt., or from about 0.01% to about 5.0% by wt., or from about 0.1% to about 2% by wt., or from about 0.1% to about 1.5% by wt., or from about 0.40% to about 0.60% by wt. of at least one nitrogen containing compound selected from the group consisting of a $C_{4-12}$ alkylamine, a polyalkylenimine, and a polyamine; and optionally from about 0.10% to about 10% by wt., or from about 0.01% to about 5.0% by wt., or from about 0.1% to about 2% by wt., or from about 0.1% to about 1.5% by wt. of at least one chelating agent.

In one embodiment, the etching solution is suitable for the selective removal of TiSiN over hafnium oxide from a microelectronic device, which consists essentially of, or consists of: from about 0.5% to about 50% by wt., or from about 1% to about 20% by wt., or 1% to about 15% by wt., or from about 1% to about 10% by wt. of at least one alkaline ammonium compound (neat); from about 0.5% to about 30% by wt., or from about 0.5% to about 20% by wt., or 1% to about 15% by wt., or from about 1.5% to about 10% by wt. of at least one peroxide compound (neat); from about 1% to about 60% by wt., or from about 2% to about 30% by wt., or from about 5% to about 15% by wt. water-miscible solvent; and from about 0.10% to about 10% by wt., or from about 0.01% to about 5.0% by wt., or from about 0.1% to about 2% by wt., or from about 0.1% to about 1.5% by wt., or from about 0.40% to about 0.80% by wt. of at least one nitrogen containing compound selected from the group consisting of a $C_{4-12}$ alkylamine, a polyalkylenimine, and a polyamine, and optionally from about 0.10% to about 10% by wt., or from about 0.01% to about 5.0% by wt., or from about 0.1% to about 2% by wt., or from about 0.1% to about 1.5% by wt. of at least one chelating agent, wherein the remainder is water.

In another embodiment there is provided an etching solution suitable for the selective removal of TiSiN over hafnium oxide from a microelectronic device, which comprises, consists essentially of, or consists of: from about 3.7 to about 4.5 wt. % or 3.8 to about 5.6 wt. % neat of at least one alkaline ammonium compound selected from the group consisting of ammonium hydroxide, a quaternary ammonium hydroxide, ammonium fluoride, and a quaternary ammonium fluoride; from about 3.9 to about 4.5 wt. % neat of at least one peroxide compound; from about 10 to about 15 wt. % or from about 7 to about 12 wt. % of a water-miscible organic solvent; from about 0.4 to about 0.6 wt. % or from about 0.5 to about 1.6 wt. % of at least one nitrogen containing compound selected from the group consisting of a $C_{4-12}$ alkylamine, a polyalkylenimine, and a polyamine; water; and optionally from about 0.4 to about 0.6 wt. % or from about 0.5 to about 1.6 wt. % of a chelating agent.

In another embodiment there is provided an etching solution suitable for the selective removal of polysilicon over silicon oxide from a microelectronic device, which comprises, consists essentially of, or consists of: about 4.1 wt. % of ammonium hydroxide (neat); about 4.3% of hydrogen peroxide (neat); from about 0.4 to about 1.2 wt. % of ammonium fluoride (neat); about 10% of a water-miscible organic solvent; from about 0.30 to about 0.8% or from about 0.2 to about 1% of at least one nitrogen containing compound selected from the group consisting of a $C_{4-12}$ alkylamine, a polyalkylenimine, and a polyamine; water; and optionally from about 0.30 to about 0.8% or from about 0.2 to about 1% of at least one chelating agent.

The etching solution composition of the present invention is typically prepared by mixing the components together in a vessel at room temperature until all solids have dissolved in the aqueous-based medium.

Method

In another aspect there is provided a method for selectively enhancing the etch rate of TiSiN relative to hafnium oxide in a composite semiconductor device comprising TiSiN and hafnium oxide, the method comprising the steps of: contacting the composite semiconductor device comprising TiSiN and hafnium oxide with an aqueous composition comprising: water; at least one alkaline ammonium compound selected from the group consisting of ammonium hydroxide, a quaternary ammonium hydroxide, ammonium fluoride, and a quaternary ammonium fluoride; at least one peroxide compound; a water-miscible organic solvent; at least one nitrogen containing compound selected from the group consisting of a $C_{4-12}$ alkylamine, a polyalkylenimine, and a polyamine, and optionally at least one chelating agent; and rinsing the composite semiconductor device after the TiSiN is at least partially removed, wherein the selectivity of the etch for TiSiN over hafnium oxide is greater than 30.

An additional drying step may also be included in the method. "At least partially removed" means removal of at least 50% of the material, preferably at least 80% removal. Most preferably, 100% removal using the compositions of the present development.

The contacting step can be carried out by any suitable means such as, for example, immersion, spray, or via a single wafer process. The temperature of the composition during the contacting step is preferably from about 25 to 100° C. and more preferably from about 40 to 75° C. In some embodiments, the contacting step is performed at a temperature of about 60° C. or greater. In other embodiments, the contacting step is performed at a temperature of about 40° C. or greater. In other embodiments, the contacting step is performed at a temperature of from about 40° C. to about 80° C. The contact time may be from about 1 to 60 minutes.

Compositions of the present invention surprisingly exhibit excellent etch selectivity for TiSiN over hafnium oxide when used on substrates that include TiSiN and hafnium oxide such as, for example, during the manufacture of a p-type microelectronic device. The term "selectivity" is typically used to refer to a ratio of etch rates of two materials. Compositions according to the present invention, in some embodiments, exhibit a wet etch selectivity for TiSiN/hafnium oxide >10. In other embodiments, the etch rate selectivity of TiSiN/hafnium oxide >30. In other embodiments, the etch rate selectivity of TiSiN/hafnium oxide >100. In yet other embodiments, the etch rate selectivity of TiSiN/hafnium oxide >500. In still other embodiments, the etch rate selectivity of TiSiN/hafnium oxide >1000. In still other embodiments, the etch rate selectivity of TiSiN/hafnium oxide >3000. In still other embodiments, the etch rate selectivity of TiSiN/hafnium oxide >5000.

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and an organic solvent such as, for example, isopropyl alcohol.

After the contacting step and the optional rinsing step is an optional drying step that is carried out by any suitable means, for example, isopropyl alcohol (IPA) vapor drying, heat, or by centripetal force.

The features and advantages are more fully shown by the illustrative examples discussed below.

EXAMPLES

General Procedure for Preparing the Cleaning Compositions

All compositions which are the subject of the present Examples were prepared by mixing the components in a 250 mL beaker with a ½" Teflon-coated stir bar. Typically, the first material added to the beaker was deionized (DI) water followed by the other components in no particular order.

Processing Conditions

Etching tests were run using 100 g of the etching compositions in a 250 ml beaker with a ½" round Teflon stir bar set at 400 rpm. The etching compositions were heated to a temperature of about 40 to 60° C. on a hot plate. The test coupons were immersed in the compositions for about 10 minutes while stirring.

The segments were then rinsed for 3 minutes in a DI water bath or spray and subsequently dried using filtered nitrogen. Etch rates were measured from 40° C. to 60° C. for 2 minutes on a TiSiN wafer and 10 minutes for a $HfO_2$ wafer. The TiSiN and $HfO_2$ etch rates were measured by ellipsometer (SCI FilmTek SE2000). The etch rates are calculated by the thickness difference before and after treatment divided by immersion time. Typical starting layer thickness was 100 Å for TiSiN and 20 Å for hafnium oxide The temperature of the etching solution upon use may be appropriately determined according to etching conditions or material of the substrate used.

The treating time upon the etching treatment with the TiSiN etching solutions disclosed herein, i.e., the time required for etching the TiSiN, is usually in the range of from about 0.1 to about 10 min, preferably from 0.2 to 8 min and more preferably from 0.3 to 5 min, and may be appropriately determined according to etching conditions or material of the substrate used.

The formulations evaluated below demonstrate that the hafnium oxide etch rate could be suppressed by adding oxide inhibitors in alkaline formulation. The etch rate selectivity on TiSiN/hafnium oxide could be maintained once the inhibitor is added.

For comparison, the following data provides a performance baseline for the prior art SC1 etch performance.

TABLE 1

| $HfO_2$ etch rate in SC1 ($NH_4OH/H_2O_2/DIW$ = 1:1:5) | | | |
|---|---|---|---|
| SC1 | TiSiN | HfO2 | TiSiN/HfO2 |
| 50° C. | 25.1 | 0.3 | 83.8 |
| 55° C. | 36.0 | 0.5 | 71.9 |
| 60° C. | 48.0 | 0.8 | 60.1 | unit: A/min

In addition to the e/r of $HfO_2$ on blanket wafer, XPS was used to check the $HfO_2$ loss when treated with SC1. The $HfO_2$ coupon was processed with SC1 at 60° C. for 10 mins and then XPS analysis was performed to check $HfO_2$ loss by monitoring the Hf intensity.

Potential candidates for $HfO_2$ protection as list in table 2 have been screened. It is found that the molecules with amine functional group provides the best $HfO_2$ protection. The XPS results also support better protection of $HfO_2$ by adding PMDETA to SC1.

TABLE 2

| Investigation of $HfO_2$ Corrosion Inhibition | | | | | | | | | |
|---|---|---|---|---|---|---|---|---|---|
| | SC1 | 516A | 516B | 516C | 516D | 516E | 516F | 516G | 516H | 516I |
| NH4OH (29%) | 14.3 | 14.3 | 14.3 | 14.3 | 14.3 | 14.3 | 14.3 | 14.3 | 14.3 | 14.3 |
| H2O2 (30%) | 14.3 | 14.3 | 14.3 | 14.3 | 14.3 | 14.3 | 14.3 | 14.3 | 14.3 | 14.3 |
| DIW | 71.4 | 70.9 | 70.9 | 70.9 | 70.9 | 70.9 | 70.9 | 70.9 | 70.9 | 70.9 |
| glycine | | 0.5 | | | | | | | | |
| L-Cysteine 98% | | | 0.5 | | | | | | | |
| SAS10 | | | | 0.5 | | | | | | |
| surfynol 485 | | | | | 0.5 | | | | | |
| dynol 607 | | | | | | 0.5 | | | | |
| CTAB | | | | | | | 0.5 | | | |
| lupasol 800 | | | | | | | | 0.5 | | |
| Pentamethyldiethylene triamine (PMDETA) | | | | | | | | | 0.5 | |
| octylamine | | | | | | | | | | 0.5 |
| HfO2 etch rate (A/min) @ 60 C. | 0.8 | 0.5 | 0.6 | 0.4 | 0.5 | 0.4 | 0.3 | 0.003 | 0.001 | 0.003 |

Where the Surfynol® 485, Dynol® 607 are non-ionic surfactants, SAS® 10 is anionic surfactant, CTAB is cationic surfactant and Lupasol® 800 is a nitrogen containing polymer; and the $H_2O_2$ is a 30% aqueous solution.

The results are shown graphically in FIG. 1.

For TiSiN patterning, SC1 gives an acceptable TiSiN etch rate with 20-30 Å/min at 50° C. However, after removing the bulk TiSiN film, some Si residue is found on the surface of $HfO_2$. It is desired to improve the Si removal capability of SC1.

In terms of a redox reaction, Si in TiSiN will be oxidized to $SiO_2$ in the presence of hydrogen peroxide. Increasing the $SiO_2$ etch rate of SC1 may help to minimize the Si residue in the intermixing layer.

Solvent effect and $SiO_2$ etchant were examined to increase the etch rate of $SiO_2$. The results are shown in Table 3.

TABLE 3

Solvent effect on TiSiN and TEOS etch rates.

|  | 524A | 524B | 524C | 524D | 524E |
|---|---|---|---|---|---|
| NH4OH (29%) | 14.29 | 14.29 | 14.29 | 14.29 | 14.29 |
| H2O2 (30%) | 14.29 | 14.29 | 14.29 | 14.29 | 14.29 |
| DIW | 60.12 | 60.12 | 60.12 | 60.12 | 60.12 |
| Pentamethyldiethylene-triamine (PMDETA) | 0.7 | 0.7 | 0.7 | 0.7 | 0.7 |
| EDTA | 0.6 | 0.6 | 0.6 | 0.6 | 0.6 |
| DIW | 10 |  |  |  |  |
| DPM |  | 10 |  |  |  |
| DMSO |  |  | 10 |  |  |
| sulfolane |  |  |  | 10 |  |
| BDG |  |  |  |  | 10 |
| TiSiN etch rate at 50° C. (A/min) | 32.4 | 33.1 | 33.9 | 36.1 | 35.4 |
| TEOS etch rate at 50° C. (A/min) | 1.0 | 1.5 | 1.1 | 1.4 | 1.3 |

As can be seen from Table 3, compared to the DIW solvent system, the addition of 10% organic co-solvent such as sulfolane and BDG helps to increase both the TiSiN and TEOS etch rates.

The TEOS etch rate can be further improved by adding $NH_4F$ as shown in Table 4.

TABLE 4

NH4F effect in TiSiN and TEOS etch rates

|  | 524D | 524M | 524N | 524O |
|---|---|---|---|---|
| NH4OH (29%) | 14.29 | 14.29 | 14.29 | 14.29 |
| H2O2 (30%) | 14.29 | 14.29 | 14.29 | 14.29 |
| DIW | 60.12 | 59.12 | 58.12 | 57.12 |
| Pentamethyldiethylenetriamine (PMDETA) | 0.7 | 0.7 | 0.7 | 0.7 |
| EDTA | 0.6 | 0.6 | 0.6 | 0.6 |
| sulfolane | 10 | 10 | 10 | 10 |
| NH4F(40%) | 0 | 1 | 2 | 3 |
| TiSiN etch rate at 50° C. (A/min) | 36.1 | 36 | 37.8 | 39.1 |
| TEOS etch rate at 50° C. (A/min) | 1.4 | 2.1 | 2.5 | 2.7 |

TABLE 5

Temperature effect on formulation 524O

| 5240 | TiSiN | TEOS | HfO2 |
|---|---|---|---|
| 50 C. | 39.1 | 2.7 | 0.01 |
| 55 C. | 47.3 | 3.4 | 0.02 |
| 60 C. | 56.8 | 4.7 | 0.08 |

The TiSiN and TEOS etch rate could be increased by increasing temp as shown in Table 5 and maintaining the $HfO_2$ etch rate at a low level.

Figure 2:
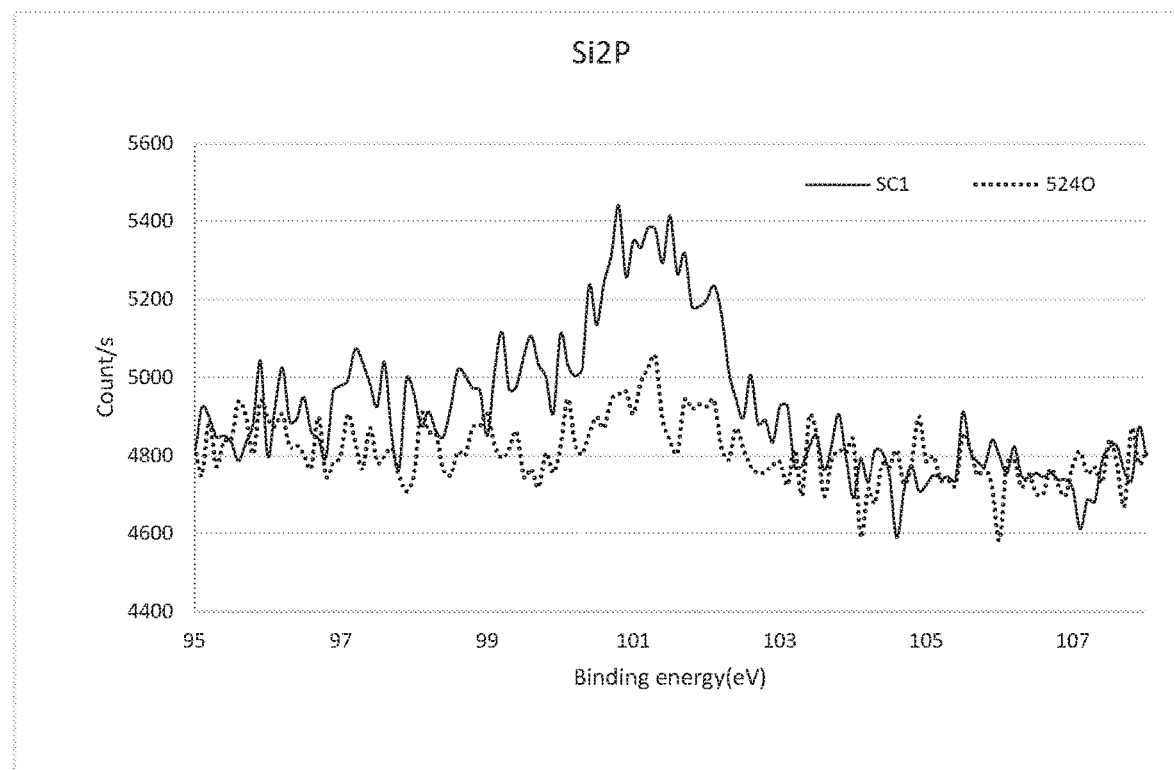
FIG. 2 is a graphic illustration of Si remaining on a substrate as determined by XPS analysis comparing SC1 to a composition disclosed herein.

A double layer (TiSiN on $HfO_2$) coupon was used to examine whether the TEOS etch rate is a good indicator for the removal of Si residue on a $HfO_2$ surface. For comparison, the TiSiN layer was etched by 5240 and SC1. XPS was then performed to check the Si signal on the surface of $HfO_2$. As can be seen from FIG. 2, the Si signal after treatment with 5240 is significantly reduced compared with SC1.

The XPS analysis shows that the oxide etch rate as a good indicator in removing Si residue in the intermixing layer.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for the selective removal of TiSiN over hafnium oxide from a microelectronic device, consisting of:
    water;
    from about 3.7 to about 4.5 wt. % neat of at least one alkaline ammonium compound selected from the group consisting of ammonium hydroxide;
    from about 3.9 to about 4.5 wt. % neat of at least one peroxide compound;
    a water-miscible organic solvent; and
    at least one nitrogen containing compound selected from the group consisting of a $C_{4-12}$ alkylamine, a polyalkylenimine, and a polyamine; and
    optionally a surfactant.

2. The etching solution of claim 1 wherein the at least one alkaline ammonium compound comprises ammonium hydroxide and ammonium fluoride.

3. The etching solution of claim 2 wherein the water-miscible organic solvent is selected from the group consisting of sulfolane, dimethylsulfoxide (DMSO), and propylene glycol; and the at least one peroxide compound is hydrogen peroxide.

4. The etching solution of claim 3 wherein the at least one nitrogen containing compound is selected from pentamethyldiethylenetriamine (PMDETA), triethylenediamine (TEDA), triethylenetetramine (TETA), tetramethylethylenediamine (TMEDA), and diethylenetriamine (DETA).

5. The etching solution of claim 3 wherein the at least one nitrogen containing compound is octylamine.

6. The etching solution of claim 3 wherein the at least one nitrogen containing compound is the polyalkylenimine.

7. The etching solution of claim 6 wherein the polyalkylenimine is polyethylenimine.

8. The etching solution of claim 3 wherein the at least one nitrogen containing compound is pentamethyldiethylenetriamine (PMDETA).

9. A method for selectively enhancing the etch rate of TiSiN relative to hafnium oxide in a composite semiconductor device comprising TiSiN and hafnium oxide, the method comprising the steps of:
    contacting the composite semiconductor device comprising TiSiN and hafnium oxide with an etching solution as set forth in claim 1; and rinsing the composite semiconductor device after the TiSiN is at least partially removed, wherein the selectivity of the etch for TiSiN over hafnium oxide is greater than 30.

10. The method of claim 9 further comprising the step of drying the semiconductor device.

11. The method of claim 9 wherein the selectivity of the etch for TiSiN over hafnium oxide is greater than 500.

12. The method of claim 9 wherein the selectivity of the etch for TiSiN over hafnium oxide is greater than 1,000.

13. The method of claim 9 wherein the contacting step is performed at a temperature of about 60° C. or greater.

14. An etching solution suitable for the selective removal of TiSiN over hafnium oxide from a microelectronic device, consisting of:
   from about 3.7 to about 4.5 wt. % neat of at least one alkaline ammonium compound selected from the group consisting of ammonium hydroxide;
   from about 3.9 to about 4.5 wt. % neat of at least one peroxide compound;
   from about 10 to about 15 wt. % of a water-miscible organic solvent;
   from about 0.4 to about 1 wt. % of at least one nitrogen containing compound selected from the group consisting of a $C_{4-12}$ alkylamine, a polyalkylenimine, and a polyamine; and
   water.

15. The etching solution of claim 14, wherein
   the at least one alkaline ammonium compound is ammonium hydroxide;
   the at least one peroxide compound is hydrogen peroxide;
   the water-miscible organic solvent is selected from the group consisting of sulfolane, propylene glycol, and dimethylsulfoxide (DMSO); and
   the at least one nitrogen containing compound is selected from the group consisting of octylamine, pentamethyldiethylenetriamine (PMDETA), and polyethylenimine.

16. An etching solution suitable for the selective removal of TiSiN over hafnium oxide from a microelectronic device, consisting of:
   about 4.2 wt. % of ammonium hydroxide (neat);
   about 4.3% of hydrogen peroxide (neat);
   from about 0.4 to about 1.2 wt. % of ammonium fluoride (neat);
   about 10% of a water-miscible organic solvent;
   from about 0.30 to about 1% of at least one nitrogen containing compound selected from the group consisting of a $C_{4-12}$ alkylamine, a polyalkylenimine, and a polyamine; and
   water.

17. The etching solution of claim 16, wherein
   the water-miscible organic solvent is selected from the group consisting of sulfolane, propylene glycol, and dimethylsulfoxide (DMSO); and
   the at least one nitrogen containing compound is selected from the group consisting of octylamine, pentamethyldiethylenetriamine (PMDETA), and polyethylenimine.

* * * * *